(12) United States Patent
Redder et al.

(10) Patent No.: US 10,928,470 B2
(45) Date of Patent: Feb. 23, 2021

(54) HIGH DATA RATE AND REAL TIME OPERATING SYSTEM WIRELESS COUPLING FOR MEDICAL IMAGING SYSTEMS AND METHOD OF OPERATION THEREOF

(71) Applicant: KONINKLIJKE PHILIPS N.V., Eindhoven (NL)

(72) Inventors: Paul Franz Redder, Newberry, FL (US); Arne Reykowski, Newberry, FL (US); Timothy Ortiz, Gainsville, FL (US); George Randall Duensing, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 458 days.

(21) Appl. No.: 15/775,047

(22) PCT Filed: Nov. 18, 2016

(86) PCT No.: PCT/EP2016/078207
§ 371 (c)(1),
(2) Date: May 10, 2018

(87) PCT Pub. No.: WO2017/085297
PCT Pub. Date: May 26, 2017

(65) Prior Publication Data
US 2020/0292649 A1 Sep. 17, 2020

Related U.S. Application Data

(60) Provisional application No. 62/257,818, filed on Nov. 20, 2015.

(51) Int. Cl.
*G01R 33/36* (2006.01)
*G01R 33/54* (2006.01)

(52) U.S. Cl.
CPC ....... *G01R 33/3692* (2013.01); *G01R 33/543* (2013.01)

(58) Field of Classification Search
USPC .......................................... 324/309
See application file for complete search history.

(56) References Cited

U.S. PATENT DOCUMENTS

| | | | |
|---|---|---|---|
| 6,914,957 B2 | 7/2005 | Dafni et al. | |
| 6,961,604 B1 | 11/2005 | Vahasalo et al. | |

(Continued)

FOREIGN PATENT DOCUMENTS

| | | | |
|---|---|---|---|
| EP | 2477364 A1 | 7/2012 | |
| EP | 2570819 A1 | 3/2013 | |

(Continued)

*Primary Examiner* — Rodney E Fuller (57) ABSTRACT

An image acquisition system (100, 500, 600, 700). The image acquisition system may include at least one processor (110, 502-2, 610, 710) configured to control: a transmitter (112, 612) to form packets for transmission over a high-data-rate (HDR) wireless communication link (HDR-WCL) (124, 624), an image acquisition device (120, 631) to acquire image data and form HDR data, and a scheduler (114, 614) to acquire control information for controlling at least one function of the image acquisition system during the image acquisition, determine a restricted packet size for the packets of the HDR-WCL in accordance with at least deterministic timing requirements of the system, and determine a schedule for transmitting the control information in a corresponding packet of the packets in accordance with the deterministic timing requirements of the image acquisition system and the restricted packet size.

20 Claims, 7 Drawing Sheets (56) References Cited

U.S. PATENT DOCUMENTS

| | | |
|---|---|---|
| 8,953,519 B2 | 2/2015 | Bucknell et al. |
| 2006/0279284 A1* | 12/2006 | Vaughan ............ G01R 33/3692 |
| | | 324/318 |
| 2009/0140739 A1 | 6/2009 | Bennett |
| 2010/0052682 A1 | 3/2010 | Mueller |
| 2010/0259261 A1* | 10/2010 | Saes .................... G01R 33/341 |
| | | 324/309 |
| 2012/0182892 A1 | 7/2012 | Frazier et al. |
| 2013/0069644 A1 | 3/2013 | Cho et al. |
| 2013/0165767 A1 | 6/2013 | Darrow et al. |
| 2013/0181715 A1 | 7/2013 | Biber |
| 2016/0109541 A1 | 4/2016 | Hayakawa et al. |

FOREIGN PATENT DOCUMENTS

| | | |
|---|---|---|
| WO | 03032002 A1 | 4/2003 |
| WO | 2004089211 A2 | 10/2004 |
| WO | 2007140088 A2 | 12/2007 |
| WO | 2014203943 A1 | 12/2014 |

\* cited by examiner

HIGH DATA RATE AND REAL TIME OPERATING SYSTEM WIRELESS COUPLING FOR MEDICAL IMAGING SYSTEMS AND METHOD OF OPERATION THEREOF

CROSS REFERENCE TO RELATED APPLICATIONS

This application is a U.S. national phase application of International Application No. PCT/EP2016/078207, filed on Nov. 18, 2016, which claims the benefit of U.S. provisional Application Ser. No. 62/257,818 filed on Nov. 20, 2015 and is incorporated herein by reference.

The present system relates to a communication system for time and data intensive medical imaging systems such as magnetic resonance (MR) imaging (MRI) and spectroscopy (MRS) systems and, more particularly, to a high data rate and real-time operating system (RTOS) wireless communication system for MRI and MRS systems, and a method of operation thereof.

Typically, MRI systems have stringent requirements for communication systems which effect communication between components of the MRI system. For example, MRI communication systems must simultaneously support high-date-rate (HDR) operation and deterministic operation (e.g., real-time operating system (RTOS)). Modern MRI systems typically employ radio-frequency (RF) coils which can acquire MR data for a plurality of channels in parallel and afterwards digitize this data to form digital content. Due to the size of this content, data rates typically greater than 1 GBPS are required to transfer this content to view this data in real-time such as may be necessary for MRI interventional procedures and the like. These data rates are difficult, if not impossible for prior systems to achieve in real-time wirelessly by an RF coil in the close confines of an MRI system while scanning a patient for many reasons including that RF coils require real-time control of functions of coils simultaneously with content transmission. However, the real-time control of the RF coils requires delays that are shorter than those provided by state-of-the-art HDR communication systems since conventional state-of-the art communication systems buffer data which can lead to delays that are larger than those required by the RF coils for real-time control.

Accordingly, attempting to perform real-time control of functions of coils using a conventional HDR communication system can lead to communication link failures, errors, and system instability. Any one or more of these problems can compromise patient safety during a scan. Thus, conventional wireless links do not support integrated HDR and RTOS communication as required for real-time control of MR coils.

Conventional state-of-the-art high-data-rate wireless systems used in medical imaging applications rely upon a combination of buffered data & burst mode communications (e.g., WiFi™). These approaches queue data for a burst mode transmission based on bus availability. Wireless systems that implement a RTOS have been limited to narrow-band communication (e.g., Bluetooth™). Wireless communications systems which simultaneously support high date rates and RTOS do not exist.

Accordingly, many MRI systems continue to employ physical links for communication such as galvanic cables for communication links between a system controller and the RF coils. However, these cables are undesirable as they can attenuate signals and are difficult to handle and store. Additionally, when damaged, these cables can heat up and/or lead to high patient specific absorption rate (SAR) levels. Although other types of links such as fiber optic links have been employed for communication with RF coils, these links require mechanical couplings that are undesirable from handling and aesthetics standpoints. Further, mechanical couplings make it difficult or impossible to correctly position RF coils such as a mobile RF coil (MRF) for scanning.

Accordingly, embodiments of the present system may overcome these and/or other disadvantages of conventional MRI and MRS systems.

The system(s), device(s), method(s), arrangements(s), user interface(s), computer program(s), processes, etc. (hereinafter each of which will be referred to as system, unless the context indicates otherwise), described herein address problems in prior art systems.

One aspect of the present system is to utilize a high data rate communication protocol with a reduced minimum packet size to simultaneously support RTOS deterministic timing requirements and provide data sufficient for MRI medical imaging. Any high data rate communication protocol may be used in accordance with aspects of the present system. Exemplary high data rate wireless communication protocols include IEEE 802.11, IEEE 802.15, ultra-wide-band (UWB) and TS 36.104 though others may also be suitably utilized and modified as discussed herein. In accordance with one embodiment of the present system, this change can be made in the medium access control (MAC) layer of the communication protocol and may be implemented using either time division duplex or frequency division duplex for full duplex communication.

In accordance with embodiments of the present system, there is disclosed an image acquisition system. The image acquisition system may include at least one of a processor configured to control: a transmitter to form packets for transmission over a high-data-rate (HDR) wireless communication link (HDR-WCL), an image acquisition device to acquire image data and form HDR data, and a scheduler to acquire control information for controlling at least one function of the image acquisition system during the image acquisition, determine a restricted packet size for the packets of the HDR-WCL in accordance with at least deterministic timing requirements of the system, and determine a schedule for transmitting the control information in a corresponding packet of the packets in accordance with the deterministic timing requirements of the image acquisition system and the restricted packet size.

It is further envisioned that the transmitter may be further configured to restrict the packet size of the packets for transmission based upon the restricted packet size determined by the scheduler. It is also envisioned that the restricted packet size may be determined by the scheduler to be a packet size which provides for real-time-operating-system (RTOS) control and high-data-rate information transfer of the HDR data using the same HDR-WCL. It is further envisioned that the at least one processor may control the transmitter to establish the HDR-WCL in accordance with a wireless transmission protocol, standard, etc., however with a packet size determined by the restricted packet size. As appreciated, other communication protocols may also be suitably applied and modified as described herein.

In accordance with embodiments of the present system, the packet size of the restricted packets may be reduced (e.g. changed) from a minimum packet size determined in accordance with a wireless transmission protocol standard to provide real-time-operating-system (RTOS) control. In accordance with embodiments of the present system, the at least one processor may determine whether a real-time-operating-system (RTOS) control word is scheduled for transmission, may place the control word in a current packet for transmission when it is determined that the RTOS control word is currently scheduled for transmission, and/or may place the image data in packets when it is determined that the RTOS control word is not currently scheduled for transmission. In accordance with embodiments of the present system, the at least one processor, at a medium access control (MAC) sublayer of an open systems interconnection (OSI) model protocol stack, may change a packet size by reducing the packet size to the determined restricted packet size.

In accordance with embodiments of the present system, the control information may include at least magnetic resonance (MR) sequence information for controlling at least one of gradient and radio-frequency (RF) coils. It is further envisioned that the image information may be acquired using optical and/or magnetic resonance (MR) methods. In accordance with embodiments of the present system, a robotic manipulator may be provided that may be controlled by the at least one processor in accordance with the control information.

In accordance with embodiments of the present system, there is disclosed a data transmission method performed by an image acquisition system having at least one processor, the data transmission method controlled by the at least one processor. The method may include one or more acts of: controlling a transmitter to form packets for transmission over a high-data-rate (HDR) wireless communication link (HDR-WCL), controlling an image acquisition device to acquire image data and form corresponding HDR data, and/or controlling a scheduler to: acquire control information for controlling at least one function of the image acquisition system during the image acquisition, determine a restricted packet size for the packets of the HDR-WCL in accordance with at least deterministic timing requirements of the system, and determine a schedule for transmitting the control information in a corresponding packet of the packets in accordance with the deterministic timing requirements of the image acquisition system and the restricted packet size. In accordance with the method, the at least one processor may be operative to place the control information in selected packets for transmission according to the schedule and place the image data in at least one other packet.

The method may further include an act of restricting the packet size of the packets for transmission based upon the restricted packet size determined by the scheduler. In accordance with embodiments of the present system, the restricted packet size may be determined by the scheduler to be a packet size which provides for real-time-operating-system (RTOS) control and high-data-rate information transfer of the HDR data using the same HDR-WCL. It is also envisioned that the method may include an act of controlling the transmitter to establish the HDR-WCL in accordance with a wireless transmission protocol standard, with a changed packet size determined by the restricted packet size. It is further envisioned that the packet size of the restricted packets may be reduced from a minimum packet size determined in accordance with a wireless transmission protocol standard to provide real-time-operating-system (RTOS) control.

In accordance with embodiments of the present system, there is disclosed a computer program stored on a computer readable memory medium, the computer program may be configured for packet communication, the computer program comprising: a program portion configured to: control a transmitter to form the packets for transmission over a high-data-rate (HDR) wireless communication link (HDR-WCL), control an image acquisition device to acquire image data and form corresponding HDR data, and control a scheduler to: acquire control information for controlling at least one function of the image acquisition system during the image acquisition, determine a restricted packet size for the packets of the HDR-WCL in accordance with at least deterministic timing requirements of the system, and/or determine a schedule for transmitting the control information in a corresponding packet of the packets in accordance with the deterministic timing requirements of the image acquisition system and the restricted packet size, wherein the at least one processor may be operative to place the control information in selected packets for transmission according to the schedule and place the image data in at least one other packet.

In accordance with embodiments of the present system, the program portion may be further configured to restrict the packet size of the packets for transmission based upon the restricted packet size determined by the scheduler. It is further envisioned that the program portion may be further configured to control the transmitter to form the restricted packet size to be a packet size which provides for real-time-operating-system (RTOS) control and high-data-rate information transfer of the HDR data using the same HDR-WCL. It is further envisioned that the program portion may be further configured to control the transmitter to establish the HDR-WCL in accordance with a wireless transmission protocol standard with a changed packet size determined by the restricted packet size. It is also envisioned that the program portion may be further configured to reduce the packet size of the restricted packets from a minimum packet size determined in accordance with a wireless transmission protocol standard to provide real-time-operating-system (RTOS) control.

The present invention is explained in further detail in the following exemplary embodiments and with reference to the figures, where identical or similar elements may be partly indicated by the same or similar reference numerals, and the features of various exemplary embodiments being combinable. In the drawings.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well-known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

For the sake of clarity, embodiments of the present system may be shown and described with respect to communication between a wireless RF coil (WRF) and a system controller of an MRI system. However, it is also envisioned that embodiments of the present system may provide wireless communication methods between other portions of the MRI system as well as communication in other types of medical, optical and other applications where high-bandwidth and RTOS control via high-data-rate (HDR) wireless communication is required. For example, embodiments of the present system may be employed in a RTOS-controlled optical robotics and/or assembly systems and the like. Similarly, embodiments of the present system may enable communication between two WRFs so that control information (e.g. RTOS) and/or acquired MR information (e.g., image information) may be exchanged using an HDR data link operating in accordance with embodiments of the present system. The present system may be suitably utilized in any wireless application where there is a high frequency data steam and control data needs to be highly time accurate with low latency to satisfy a given deterministic environment.

Figure 1:
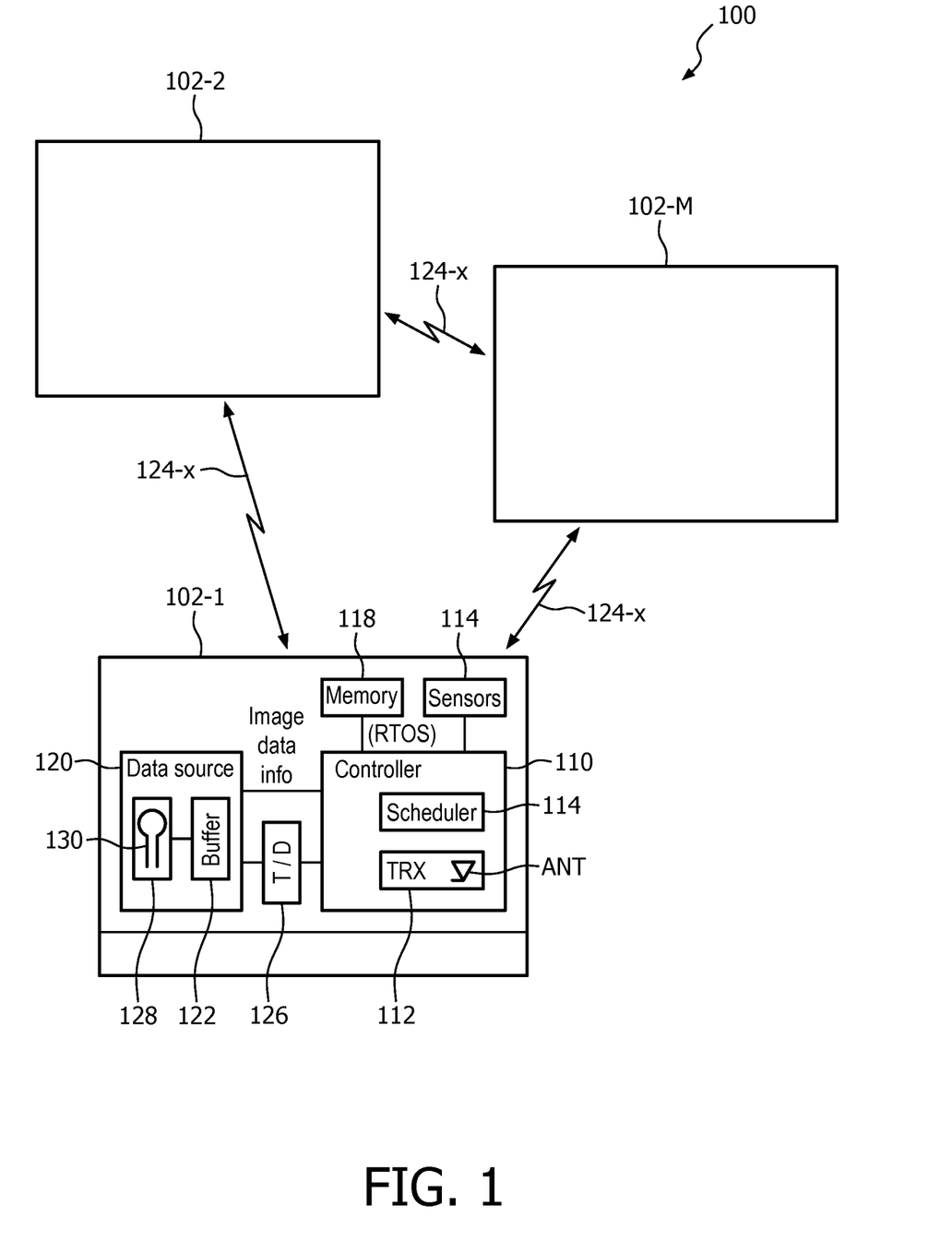
FIG. 1 shows a schematic side view of a portion of an MRI system operating in accordance with embodiments of the present system.

FIG. 1 shows a schematic side view of a portion of an MRI system 100 (hereinafter system 100 for the sake of clarity) operating in accordance with embodiments of the present system. The system 100 may include a plurality of modules 102-1 through 102-M (e.g., where M is an integer), each of which may be referred to generally as 102-x and may be coupled to each other to communicate with one or more of each other via a high-data-rate (HDR) wireless communication link such as a wireless coupling 124-x in accordance with embodiments of the present system.

In accordance with embodiments of the present system, one or more of the modules 102-x may communicate with and/or control other modules 102-x, as may be desired. Further, one or more of the modules 102-x may be similar to, or different from, each other and may share and/or operate with functionality of one or more of the other modules 102-x. For example, for the sake of clarity, module 102-2 is discussed as a system control module (e.g., a system controller and/or master) and the other modules (e.g., 102-1 and 102-M) as driven modules (e.g., controlled and/or slave modules) such as transmit (Tx) and/or Receive (Rx) RF modules. To simplify the discussion herein, module 102-1 is discussed as a wireless receive-only RF coil (WRF) and may include RTOS functionality. As appreciated, the term "receive-only" refers to interaction with patient data and does not imply that the receive-only RF coil does not receive and/or transmit information, such as control information and/or transmit "received" image information as discussed further herein.

For example, in accordance with embodiments of the present system, the module 102-1 may include a controller 110, a memory 118, sensors 116, and a data source 120 which may acquire and/or otherwise obtain HDR data. The data source 120 may typically acquire information such as MR information and/or optical information. Thus, in MR embodiments, the data source may include MR coils 128 such as an array of coils 130 and a tuner/detuner (T/D) 126 which may tune and/or detune the array of coils (or portions thereof) under the control of the controller 110.

The controller 110 may control the overall operation of the module 102-x and/or other modules 102-x. The controller 110 may receive operating instructions such as real-time-operating-system (RTOS) control information (ROTSCI) that may be generated by the system and/or otherwise stored in the memory of the system such as the memory 118 and may process the RTOSCI in accordance with embodiments of the present system. The controller 110 may include a scheduler 114 and a transmitter and/or receiver (TRX) 112. The scheduler 114 may schedule RTOS sequence information and the TRX 112 may control transmission and/or reception of information using any suitable communication methods in accordance with embodiments of the present system. For example, the TRX 112 may be operative as a medium access controller to form medium access control (MAC) protocol data units (PDU) (MPDUs) which may include packets generated in accordance with embodiments of the present system. Further, the TRX 112 may be operative as a data-link layer to process the MPDUs and transmit the MPDUs over the wireless coupling 124-x. The TRX 112 may include at least one antenna (ANT) for communicating via the wireless coupling 124-x with one or more of the other modules 102-x. Accordingly, one or more of the modules 112-x may communicate with one or more other modules 112-x using the wireless coupling 124-x as a high-data-rate (HDR) wireless communication link (HDR-WCL).

The wireless coupling 124-x may support any suitable wireless communication link(s) that may support the HDR-WCL. The HDR-WCL for example may have a throughput of more than 1 GB/sec and may use a modified packet size (e.g., <1 KB modified from >4 KB) to support RTOS deterministic timing requirements as set forth by embodiments of the present system. For example, a prior system may utilize a first transmission system and data stream with a small packet size to satisfy RTOS deterministic requirements and a second transmission system and data stream for image data with a relatively larger packet size (e.g., >4 KB) than the first transmission system to satisfy the HDR of the image data. In accordance with the present system, a single wireless data stream is utilized with a reduced packet size (e.g., restricted packet size of, for example, between 1 bit and 1 KB) from standard transmission systems to meet RTOS deterministic timing requirements while also meeting the higher data throughput requirements for image data. For example, to maximize the efficiency of a data link (e.g., the HDR-WCL), these packets may be larger than a size of a control message (e.g., RTOSCI size) though need not be (i.e., packet size may be size of the control message). For example, a size of a data packet in accordance with embodiments of the present system may be determined by data link throughput of the wireless transmission system, data link availability of the wireless transmission system and/or a size of a control message utilized. The packets sizes discussed herein are for illustrative purposes and are not intended to limit the potential selection of packet sizes that may be determined in accordance with embodiments of the present system.

Accordingly, the HDR-WCL may transmit a predetermined amount of data for RTOS operation of the system over the same HDR-WCL that may transmit wideband data such as image data which may require more than 1 GB/sec of bandwidth for example. Throughput of the HDR-WCL may vary (e.g., decrease) slightly from those set forth by suitable standards and/or protocols. For example, suitable HDR-WCLs that may be modified in accordance with embodiments of the present system may be set forth by the IEEE (Institute of Electrical and Electronics Engineers) wireless transmission protocol standard, such as IEEE 802.11, Wi-Fi™, ultra-wideband (UWB) and/or other wireless communication protocols, standards, methods, etc. For example, the IEEE 802.11 protocol may be modified in accordance with embodiments of the present system to provide RTOS control as well as transmission of HDR data (e.g., data in excess of 1 GB/sec w/ a data packet size <1 KB). However, it is also envisioned that other wideband communication methods such as ones that may be capable of performance in excess of 1 GB/sec as modified by embodiments of the present system may be employed as well. While an illustrative throughput and packet size is discussed herein, other throughput and/or packets sizes may be employed in accordance with one or more embodiments of the present system.

The sensors 116 may include one or more sensors which may sense various operating conditions and/or parameters in and/or in the vicinity of the modules 102-x. For example, the sensors 116 may sense operating voltage, current, as well as patient vitals such as heart rate, blood pressure, oxygen level, etc. In accordance with embodiments of the present system, the one or more sensors may form corresponding sensor information including information regarding RTOSCI related to the sensor and provide this information to the controller 110 for further processing. The memory 118 may store the sensor information including the RTOSCI for later use in any desired manner. For example, the memory 118 may store one or more magnetic resonance scan sequences in accordance with a given scan type (e.g., head scan, body scan, knee scan, shoulder scan, etc.).

The data source 120 may be a high-volume data source such as an image acquisition device or the like which may generate and/or otherwise obtain image information using optical and/or MR methods. For example, the data source 120 may include an optical camera and/or an MR radio-frequency (RF) array. Further, the data source 120 may include a buffer 122 for buffering data for output such as the image information or the like. The optical camera may provide optical image information which may be analyzed by the system 100 to determine, for example, proper placement of, for example, a patient in an MR bore for scanning and/or objects which may be assembled by embodiments of the present system using a multi-axis manipulator as may be described with reference to FIG. 6 below. Referring back to FIG. 1, the scheduler 114 may obtain the RTOSCI from any suitable source such as from the memory 118 and determine a schedule for transmitting the RTOSCI and/or determining packet size in accordance with embodiments of the present system. While a packet size may change for example based on a change in RTOSCI, image throughput requirements, scan type, sensor information, etc., in accordance with embodiments of the present, once selected, the packet size is then utilized for the transmission of control and image information as described.

In accordance with embodiments of the present system, one or more of the modules 102-x may further include actuators controlled by the controller such as robotic actuators. For example, in accordance with MRI and MRS embodiments, the robotic actuators may include a patient support that may change position and/or orientation of the patient during a scan. However, in accordance with embodiments of the present system, such as in robotic assembly embodiments, the robotic actuators may include robotic assemblers which may place components during a component assembly process. Image information may be acquired using optical image capture methods (e.g., cameras) rather than MR methods. Moreover, the robotic assemblers may include multi-axis manipulation portions that may manipulate a component in a plurality of or more axes (e.g., multi-axes) under the control of a controller of the system.

One or more of the modules 102-x may communicate with and/or control other modules 102-x, as may be desired. For example, module 102-2 may function as a system control module (e.g., a system controller or master) and the other modules may function as driven modules (e.g., slave modules). However, for the sake of clarity, it will be assumed that each module 102-x may be similar to each other.

With regard to the MRI and MRS embodiments, module 102-2 may function as a system controller which may generate an MR sequence that may be output by modules 102-1 and/or 102-M. More particularly, one of the modules such as the module 102-1 may function as a transmit and/or receive (TRX) RF coil that may output an RF sequence and the other module (e.g., 102-1) may receive induced MR signals from an object-of-interest (OOI) such as the patient within a scanning volume. The module 102-1 may then digitize the induced MR information to form digitized MR information and provide it to module 102-2 for further processing. It is also envisioned that the system 100 may further include a plurality of RF coils that may communicate with each other to synchronize and/or collectively acquire induced MR signals that may then be digitized and provided to one or more of the RF coils and/or to the system controller. For example, a plurality of RF coils may acquire induced MR signals, digitize the acquired induced MR information to form digitized MR information and then provide the digitized MR information to a selected RF coil and/or system controller for reconstruction. In accordance with embodiments of the present system, the reconstructed MR information may then be provided to a rendering device for rendering, may be stored in a memory of the system, and/or may be further processed (e.g., to form MR image information, MR spectrographic information, etc.).

In accordance with embodiments of the present system, the T/D 126 may be operative to de-tune the plurality of coil elements during transmit (TX) excitation and may tune the array of coils 130 to receive the induced MR signals from the OOI after excitation, under the control of the controller 110. Thereafter, the received induced MR signals may be digitized and/or reconstructed (e.g., by a reconstructor) and transmitted to a processor of the system such as the module 102-2 for rendering, further processing, and/or storage in a memory of the system as discussed.

Figure 2:
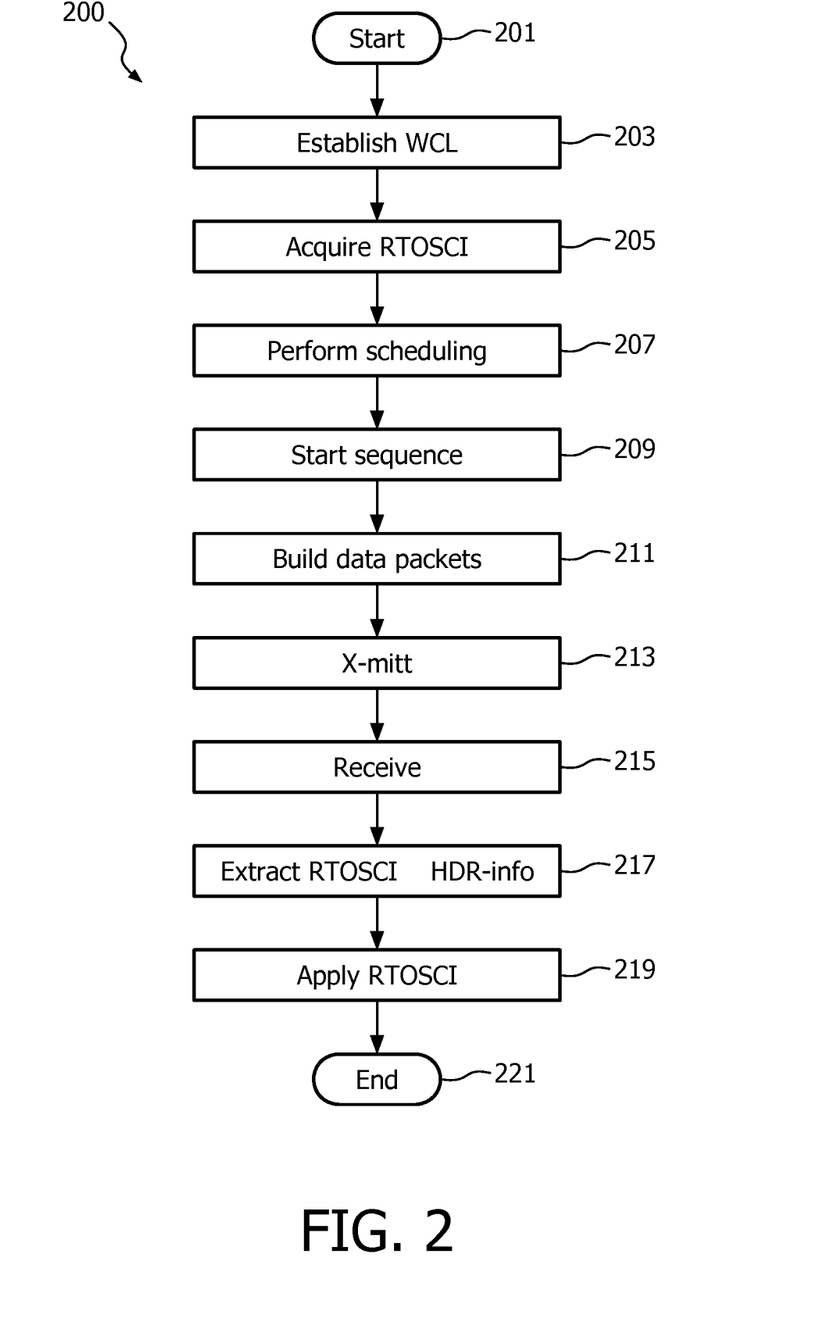
FIG. 2 shows a functional flow diagram of a process that may be performed in accordance with embodiments of the present system.

FIG. 2 shows a functional flow diagram of a process 200 that may be performed in accordance with embodiments of the present system. The process 200 may be performed using one or more computers communicating over a network and may obtain information from, and/or store information to one or more memories which may be local and/or remote from each other. The process 200 may include one of more of the following acts. Further, one or more of these acts may be combined and/or separated into sub-acts, as desired. Further, one or more of these acts may be skipped for example depending upon system settings. For the sake of clarity, the process 200 may be described with respect to operation of an MRI or MRS systems in accordance with embodiments of the present system. However, it is also envisioned that the process 200 may be applied to other HDR systems such as optically-guided robotic assembly systems and the like. In operation, the process may start during act 201 and then proceed to act 203.

During act 203, the process may establish a wireless communication link (WCL) between two or more modules in accordance with embodiments of the present system. As discussed above, the wireless communication link may correspond with a suitable HDR-WCL operating in accordance with embodiments of the present system. After completing act 203, the process may continue to act 205 wherein the process may acquire RTOS control information (RTOSCI). The RTOSCI may be generated by the process (e.g., in response to operating parameters) and/or may be stored in a memory of the system. However, for the sake of clarity, the RTOSCI may be obtained from a memory of the system. RTOSCI may include RTOS control information that may have deterministic timing requirements associated therewith. For example, in accordance with embodiments of the present system, the process may obtain RTOSCI supporting a given scan (e.g., a knee scan, a head scan, a shoulder scan, etc.) being performed. RTOSCI may also be received from other portions of the present system such as from one or more of the sensors (e.g., sensor 116 from FIG. 1). The RTOSCI may be predefined, modified, received from one or more sources and/or may be manually entered. The RTOSCI may also be stored in a memory of the system.

Figure 3:
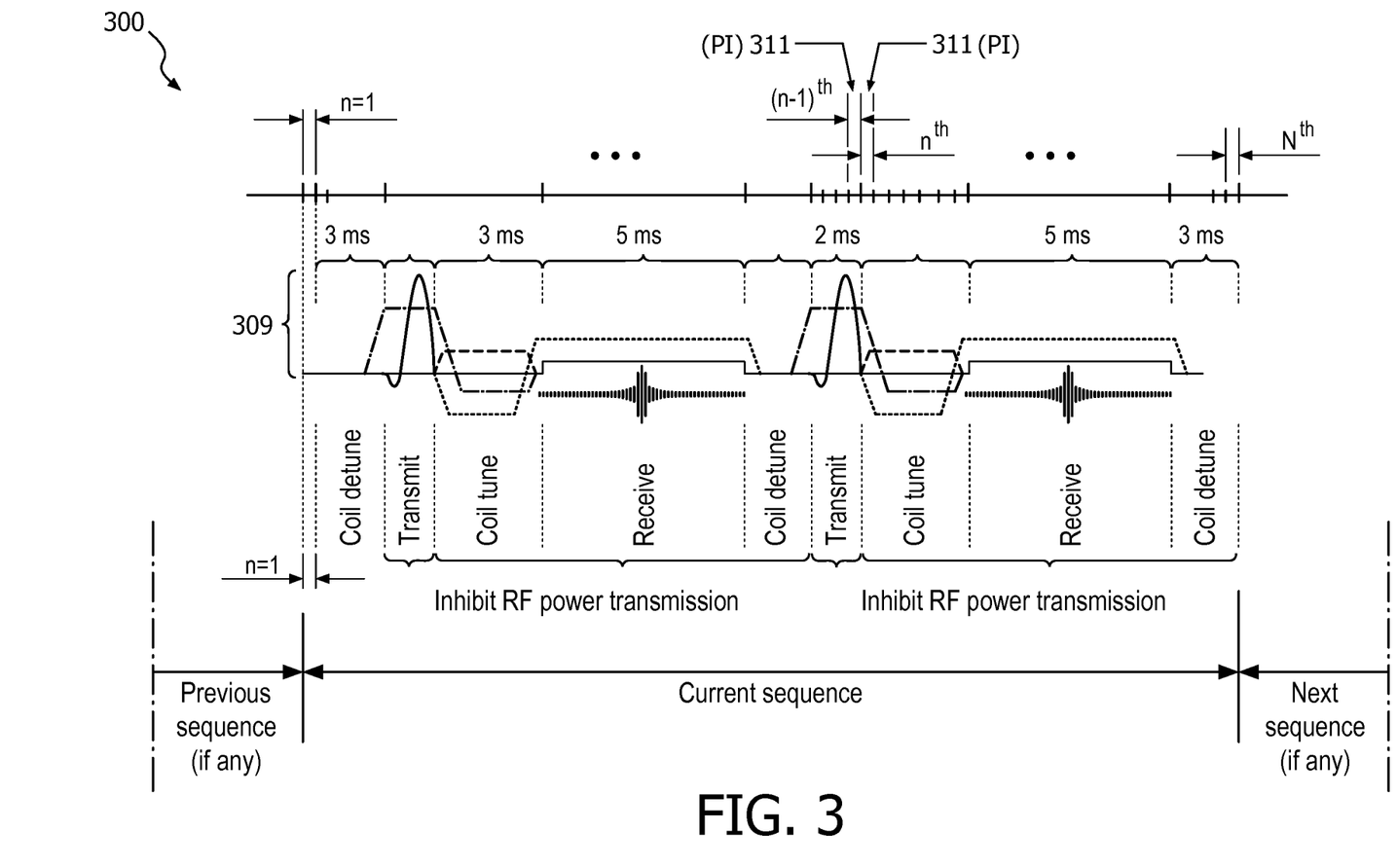
FIG. 3 shows a graph of a portion of a timing diagram for an MR scan performed in accordance with embodiments of the present system.

FIG. 3 shows a graph 300 of a portion of a timing diagram for an example of an MR scan performed in accordance with embodiments of the present system. For the sake of clarity, the timing diagram of graph 300 is provided for illustration only and it should be assumed that other timing diagrams and/or information may be suitably utilized based upon a type of scan being performed. For example, as readily appreciated by a person skilled in the art, a knee scan may have a different timing diagram than a head scan, etc. In accordance with embodiments of the present system, the information in the graph 300 such as the RTOSCI may be known a priori to implementation of the scan. With regard to the RTOSCI, this information may include system latency information which may set forth deterministic latency requirements of the system (e.g., control information must be received prior to a need to act on the control information). The RTOSCI may further set forth periodic intervals (P Is) 311 such as a 0.5 ms intervals in the present embodiments (e.g., see n) as may be described with reference to act 207 below. The PIs may be determined by the process and stored in a memory of the system for later use, as desired. In accordance with embodiments of the present system, the process may size packets and/or transmit control words in accordance with this deterministic latency.

The process may be operative to control one or more main functions of a module such as three main functions of a selected wireless RF coil in accordance with embodiments of the present system. The RTOSCI may set forth these (RTOS) functions, corresponding (RTOS) timing intervals, and/or corresponding (RTOS) commands that may require deterministic timing. For example, these functions (e.g., RTOS functions may include acts such as: coil element de-tuning (e.g., see, "Coil Detune" or detune) during TX excitation; coil element tuning (e.g., see, "Coil Tune" or tune) to receive induced MR signals during a receive period (e.g., see, "receive"); and transmit (e.g., see, "transmit") for data transmission of the received signal (e.g., the received induced MR signals) to a designated receiver such as a system controller.

For example, each of the RTOS functions (e.g., "Coil Detune'" "Coil Tune," and "transmit") may have a corresponding RTOS command which may, for example, be represented using any suitable method such as a numerical representation (e.g., a binary representation) that may be unique to the corresponding function. Each of the acts of these functions may be performed for a given duration (e.g., as defined by start and stop time) of the corresponding function. For example, Coil Tune and Coil Detune functions may for example each have a duration of 3 ms while the transmit function may have a duration of 2 ms as illustratively shown. In accordance with embodiments of the present system, the reception function may have a duration of 5 milliseconds. However, other values are also envisioned in accordance with embodiments of the present system. The operating duration and/or ordering (e.g., in time, such as sequential, overlapping, etc.) of these functions may be set in accordance with a type of scan (e.g., knee, head, elbow, shoulder, etc.) being performed and/or with a scanning sequence as desired. In accordance with embodiments of the present system, the RTOSCI may define at least some of the deterministic timing requirements of the system.

Each of these acts may correspond with an RTOS command as set forth by the RTOSCI and the process may generate one or more corresponding RTOS control words and thereafter generate one or more corresponding signals to control the WRF accordingly. These signals may be generated by a controller such as a controller of the WRF and may be provided to, for example, a controller of the system, a T/D of the WRF, and/or TRX of the WRF. In accordance with embodiments of the present system, the system may be operative to support different message lengths. Further, in accordance with embodiments of the present system, a data packet may be replaced with another time message. The acts shown in the graph 300 may be known by the system and/or otherwise determined prior to performing the scan and/or portions thereof and may be stored in a memory of the system in any suitable format (e.g., graphical, tabular, etc.) such as in corresponding RTOSCI. In accordance with embodiments of the present system, absolute or relative timing frames of reference may be used. Further, a time block may be fixed and/or variable based on the functional needs, desired, settings, etc. This capability of using fixed and/or variable time block may be utilized to ensure that RTOS requirements may be met. For example, a time block may include a combination of absolute and relative time frame, i.e., change x from an absolute time to related to another event, such as 0.5 seconds after another event. Further, the system may be operative to support different message lengths such as different RTOSCI lengths. Further, in accordance with embodiments of the present system, a data packet may be replaced with another time message.

Referring back to FIG. 2, after completing act 205, the process may continue to act 207 wherein the process may perform scheduling (e.g., a processor operating as a scheduler) in accordance with the RTOSCI. For example, the process may provide the RTOSCI to a scheduler for scheduling (e.g., sequencing). The scheduler may sequence various functions of the system (e.g., which may include RTOS functional acts) such as the acts described herein in accordance with deterministic timing requirements of the system. Thus, in accordance with embodiments of the present system, the scheduler may sequence acts of the system which may be known prior to the start of a scan (e.g. prior to implementation). However, in other embodiments, it is envisioned that the scheduler may sequence one or more functions of the system which may be determined and/or obtained during a scan. For example, in interventional MRI and/or robotic assembly embodiments, the process may determine RTOS functional acts prior to a scan or other operation and thereafter sequence these acts.

In accordance with embodiments of the present system, deterministic timing requirements may be defined by the RTOSCI and/or may be defined by delay requirements of the system. For example, for closed-loop systems operating in accordance with embodiments of the present system, options such as RTOSCI may be known apriori. However, for remotely operated systems (e.g., systems operating remote from each other such as systems operating over a network with various delays (e.g., the Internet), deterministic timing requirements may be determined in real-time. Further, in accordance with embodiments of the present system, certain actions may have a deterministic response and/or the order and/or sequence of actions of the system may be controlled by the system and/or user.

In accordance with the schedule, RTOS commands may be included in the RTOSCI and may be transmitted over the HDR-WCL (e.g., the wireless coupling 124-x) and thereafter implemented within a threshold time such as within 1 ms in the present embodiments. However other threshold times are also envisioned. The scheduler may also set the PIs to a determined value such as 0.5 ms in accordance with embodiments of the present system. For example, the PIs may be determined by the system as a lowest common denominator of the time periods such that each of the PIs may be aligned with the start and stop times of each of the acts of the functions and/or may be predetermined by the system and stored in a memory of the system for later use. Accordingly, PIs of 0.5 ms (equally-spaced) may correspond with start and stop time of each of the acts of the functions while complying with deterministic timing requirements of the system. Thus, the start and stop times for each of the acts of the functions (e.g., Tune, Detune, receive in the present embodiments) may correspond with, and/or be aligned with a start time of certain $n^{th}$ intervals as may be defined by the PIs.

In accordance with embodiments of the present system, PIs may for example be defined using one of two methods: (1) a minimum interval of the update rate of the link; or (2) a percentage (%) factor of a faster activity of the system such as transfer of an RTOS communication. Further, for example humans cannot distinguish movement <150 ms, so a 1 ms update may ensure from a human perspective, that motion is continuous. It is also envisioned that an update rate of PI(1) may contain a series of actions within a PI which results in a PI(2)<PI(1). All actions for this example may still be deterministic based on a PI(1) interval. With regard to transmission, it is assumed that RTOS commands for a given interval f(n) may be transmitted in a previous interval such as an (n−j)th interval, where j is an integer and may be set equal to 1 in the present embodiments. However, other values for j are also envisioned as may be set by the user and/or system as desired. For example, by setting j=1, the RTOS commands for the nth interval may be scheduled to be transmitted in the (n−1)th interval. This is illustrated with reference to FIG. 3 in which an nth and (n−1)th are shown for a portion of the timing diagram 300.

In accordance with embodiments of the present system, commands may be assigned to an interval (e.g., time) of an activity and not for the complete activity. For example in an embodiment of the present system that is utilized to control a robot that for example transmits a video feed to a controller station, a walk across a room may be considered to include a series of discrete acts such as, for example, x (where x is an integer) individual right foot forward—left foot forward commands generated to complete an activity. This approach allows the system to make dynamic decisions on a PI basis.

In accordance with embodiments of the present system, the scheduler may also determine data packet architecture. Accordingly, the process may determine a given packet size to both support RTOS deterministic timing requirements and support data rates sufficient for MRI imaging. In accordance with embodiments of the present system, after the packet size is determined, the process may modify the packet size from a standard packet size as may be determined by a transmission protocol or standard being used (e.g., IEEE 802.11, etc.) as discussed herein (e.g., reduce to a restricted packet size). In accordance with embodiments of the present, a packet size may be changed from a prior packet size (e.g., repeat one or more of acts 203, 205, 207, etc., as described) for example based on a change in RTOSCI, image throughput requirements, scan type, sensor information, etc., though once selected, the packet size is then utilized for the transmission of control and image information (e.g., one or more of acts 209, 211, 213, etc.) as described.

After completing act 207, the process may continue to act 209 wherein the process may start the current sequence. Accordingly, the process may begin counting intervals of the sequence as defined by the PIs. After completing act 209, the process may continue to act 211.

During act 211, the process may build data packets (e.g. at a transmitter of the process) for transmission in accordance restraints such as packet size determined by the scheduler. As previously discussed, RTOS commands for a given interval f(n) may be sent during a previous interval f(n−1) to ensure deterministic requirements. During this act, the process may determine whether RTOSCI is available for a current interval. For example, in a case wherein it is determined that RTOSCI is available for a current interval (which may be assumed to be an (n−1)th interval), the process may build a RTOS packet which may include a corresponding RTOS command(s) and place the RTOS packet within a data stream that includes packets of a protocol data unit (PDU) at a medium access controller (MAC) sublayer of an open systems interconnection (OSI) model protocol stack (e.g., layer 2 in the OSI protocol stack). In this way, the RTOS packet may be inserted into a data stream that also includes the HDR data packets while still ensuring that deterministic timing requirements of the RTOS packet are met. Further, in accordance with embodiments of the present system. As readily appreciated, since the process may further determine whether any HDR data is available (e.g., by checking a buffer of the data source) and may, in accordance with embodiments of the present system, fill remaining space within the RTOS packet (e.g., pad empty space within the packet) and/or any remaining packets within the PDU with the HDR data subject to packet size constraints as set forth by the scheduler.

However, in a case wherein it is determined that RTOSCI is not available for the a current interval (which may be assumed to be an (n−1)th interval), the process may continue to fill a current packet with HDR data. The process may look for the HDR within a buffer of an image source. In a case wherein HDR data is not available, the process may pad empty space within the packet and the HDR data may not be available at a start of a scanning process.

Figure 4:
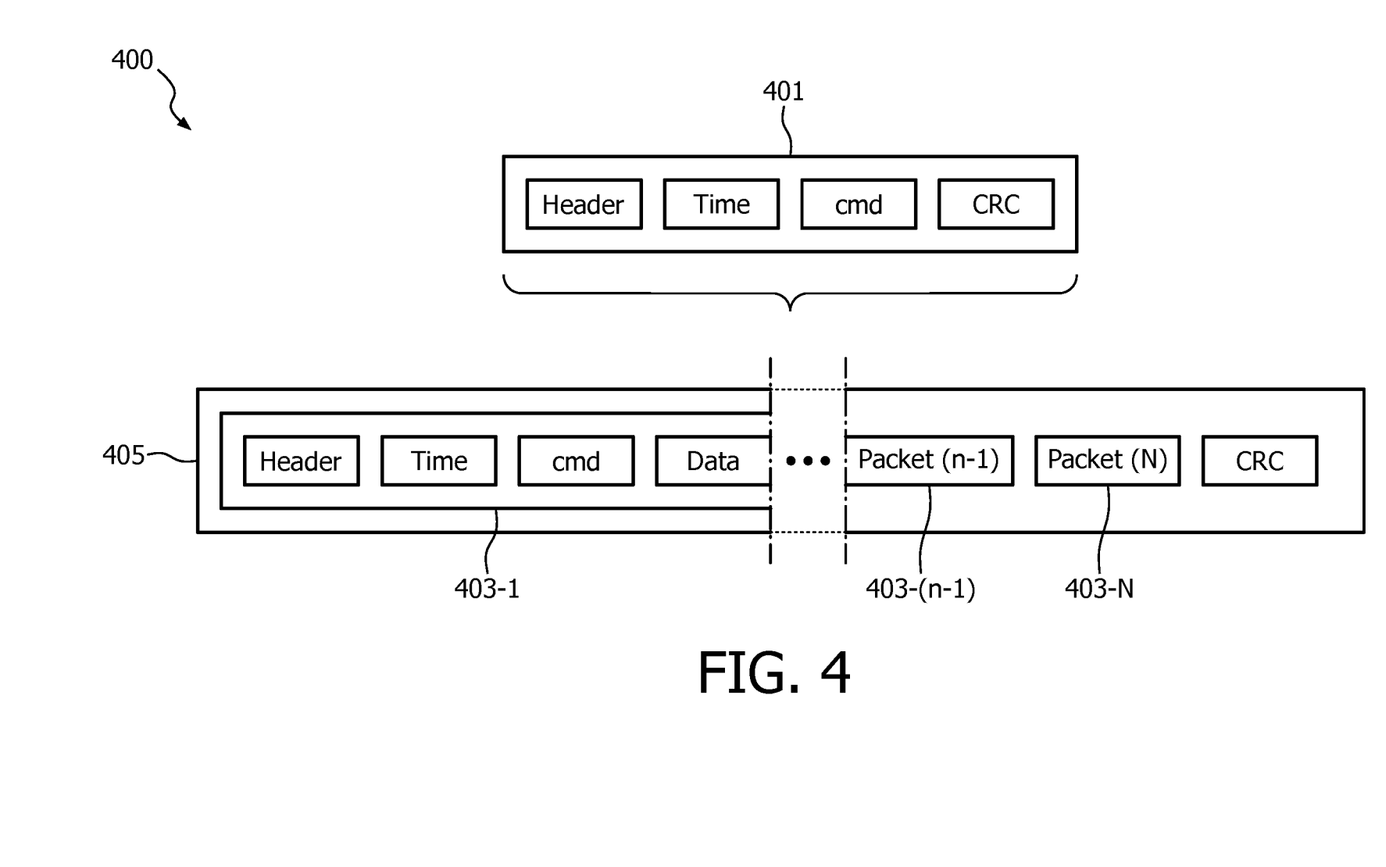
FIG. 4 shows exemplary formats for an RTOS packet and a plurality of PDUs inserted into a data stream in accordance with embodiments of the present system.

FIG. 4 shows exemplary formats 400 for an RTOS packet 401 and a plurality of MAC PDUs 403-N (e.g., Packets) inserted into a data stream 405 in accordance with embodiments of the present system. More particularly, the RTOS packet 401 may include header (header), time (time), command (cmd), and error correction (cyclic redundancy check (CRC)) information areas in accordance with embodiments of the present system. The header may be utilized to identify a packet type (e.g., RTOS packet or image packet). The header may include information such as a preamble for example that may be utilized for clock synchronization. However, in accordance with embodiments of the present system, the clock synchronization information may be located in any portion of the packet 401. The time may include data related to time such as a time stamp related to absolute (e.g., Sep. 10, 2015, 5 P.M. EST) and/or relative time values (e.g., 5 ms after presentation of packet 403-1) for example indicating, when a given RTOSCI is to be acted on (e.g., RTOSCI to tune or detune the coils). The command may include an RTOS command such as may be included in the RTOSCI; and the CRC may include one or more error correction bits. With regard to the MAC PDU 403-N, this PDU may include header (Header), time (Time), command (cmd) similar as with the RTOS packet, and data (Data), such as image data, and error correction (CRC) areas.

It should be appreciated that only a single RTOS packet 401 is shown for clarity, however clearly two or more RTOS packets may be inserted into the data stream 405 as required to satisfy any given deterministic control requirements for a given embodiment. Typically more than one RTOS packet would be employed over the course of a data stream. Further, while the CRC is shown as occupying a separate portion such as a separate packet of the data stream 405 and may be employed for error correction of more than one of the MAC PDUs as desired. The CRC may be placed into one or more of the MAC PDUs as desired. Further, while the RTOS is illustratively shown as a separate packet from the MAC PDU, in accordance with embodiments of the present system and appropriate indications in a MAC PDU header, the RTOS may be inserted as a portion of the MAC PDU.

In accordance with embodiments of the present system, one or more packets (e.g., packet 1 through packet N, where N is an integer), and error correction (CRC) areas may be similar to a conventional MAC PDU (MPDU). Accordingly, the header, time, command, and CRC areas may be similar to those defined by the communication method (e.g., IEEE 802.11, etc.) employed by the WDL. For the sake of clarity, these areas are not discussed further herein, although one or more of the packets (e.g., packet 1 through packet N) may be formed in accordance with embodiments of the present system including the RTOS packet 401 (e.g., including the RTOSCI) as well as HDR data as may be determined by the process. In accordance with embodiments of the present system, a time basis of a payload may be based on a link interval although other timing considerations may be suitably applied to provide the RTOS packet at any desired deterministic interval. In accordance with embodiments of the present system, the timing information encoded along with the payload data may be used to decode the data as may be desired irrespective of when the packet is delivered as long as the packets arrival precedes a time when it is utilized.

Referring back to FIG. 2, after completing act 211, the process may continue to act 213 where the MPDU may be transmitted to a receiving device (e.g., module 102-2) via the HDR-WCL using a communication method operating in accordance with embodiments of the present system. After completing act 213, the process may continue to act 215 during which, the process may receive the MPDU via the HDR-WCL and process it to extract any HDR data and/or an RTOS packet 401 contained within. In accordance with embodiments of the present system, the process may then continue to act 217 where RTOS commands from the RTOSCI (if available) may be extracted. Further information from the HDR data such as image information may also be extracted.

During act 219, the extracted RTOS commands from act 217 may be applied to control one or more functions of the system. In accordance with embodiments of the present system, this information may be applied within a threshold application time period of the system such as 1 ms after transmission of the RTOSCI. Accordingly, the process may implement real-time operating system functions in accordance with the RTOS control information that may have been transmitted using high-data-rate wireless link such as the HDR-WCL (e.g., the wireless coupling 124-x). During act 219, the extracted HDR data may be processed to reconstruct image(s) and/or spectrographic information which may, when reconstructed, be rendered on a display of the system. After completing act 219, the process may continue to act 221 where it may end.

Figure 5:
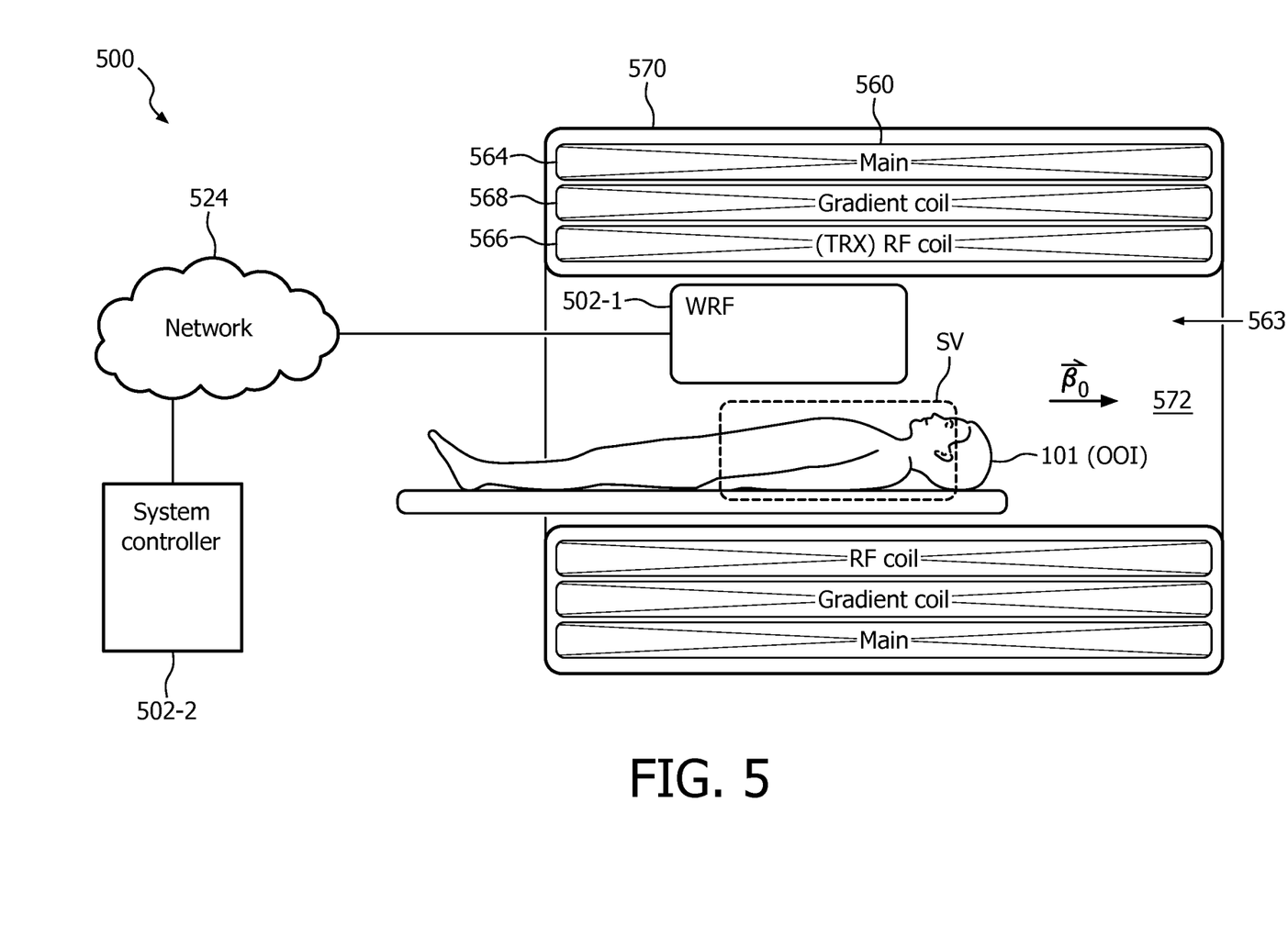
FIG. 5 shows a schematic side view of a portion of an MRI system operating in accordance with embodiments of the present system.

Embodiments of the present system applied to a closed-type MRI system are now be described with reference to FIG. 5 which shows a schematic side view of a portion of an MRI system 500 (hereinafter system 500 for the sake of clarity) operating in accordance with embodiments of the present system. The system 500 may include one or more of a system controller 502-2, an RF portion 563, a gradient coil 568, a main magnet 564, and a body 570. The RF portion 563 may include a wireless RF (WRF) coil 502-1 and transmit/receive (TRX) RF (TRX-RF) coil portion 566. In accordance with embodiments of the present system, the system 500 may be similar to the system 100. For example, the RF portion 502-1 and the system controller 502-2 may function similarly to the modules 502-1 and 502-2, respectively, and may communicate with each other via a HDR-WCL 524 that may be similar to the HDR-WCL 124.

The system controller 502-2 may control one or more of the RF coil 566, the WRF coil 502-1, the gradient coil 568, and the main magnet 564 to be able to acquire an MR scan of an object-of-interest (OOI) such as a patient 101 within a scanning volume (SV). In accordance with embodiments of the present system, the main magnet 564 may be operable under the control of the system controller 502-2 to generate a substantially main magnetic field (Bo) which may be substantially homogenous within the scanning volume (SV) of the system 500. Main magnet 564 may be of an open or closed type MR system. However, for the sake of clarity, a closed-type main magnet having a main bore 572 suitable for receiving the OOI such as the patient 101 for MR scanning.

The gradient coil 568 may include at least one coil which may generate one or more gradient fields (e.g., gradient excitation pulses) along one or more axes (e.g., $G_x$, $G_y$, and $G_z$) under the control of the system controller 502-2. These gradient fields may form at least part of an encoding sequence such as a gradient part that may be applied within at least the SV to the patient 101. With regard to the RF coil portion 563, one or more of the RF coils (566 and 502-1) may be used for imaging depending upon system settings. However, for the sake of clarity, it will be assumed that the TRX RF coil 566 may transmit RF sequences, or portions thereof, under the control of the system controller 502-1.

The WRF 502-1 may include one or more coils loops tuned to acquire induced MR signals from the patient 101 and provide corresponding received MR signals as digitized MR information to the system controller 502-2 for further processing such as for reconstruction, etc. In accordance with embodiments of the present system, the coils may include a multi-channel array of coils. The system controller 502-2 may further render the reconstructed data on a rendering device such as a display of the system and/or store the digitized MR information in a memory of the system for later use.

Figure 6:
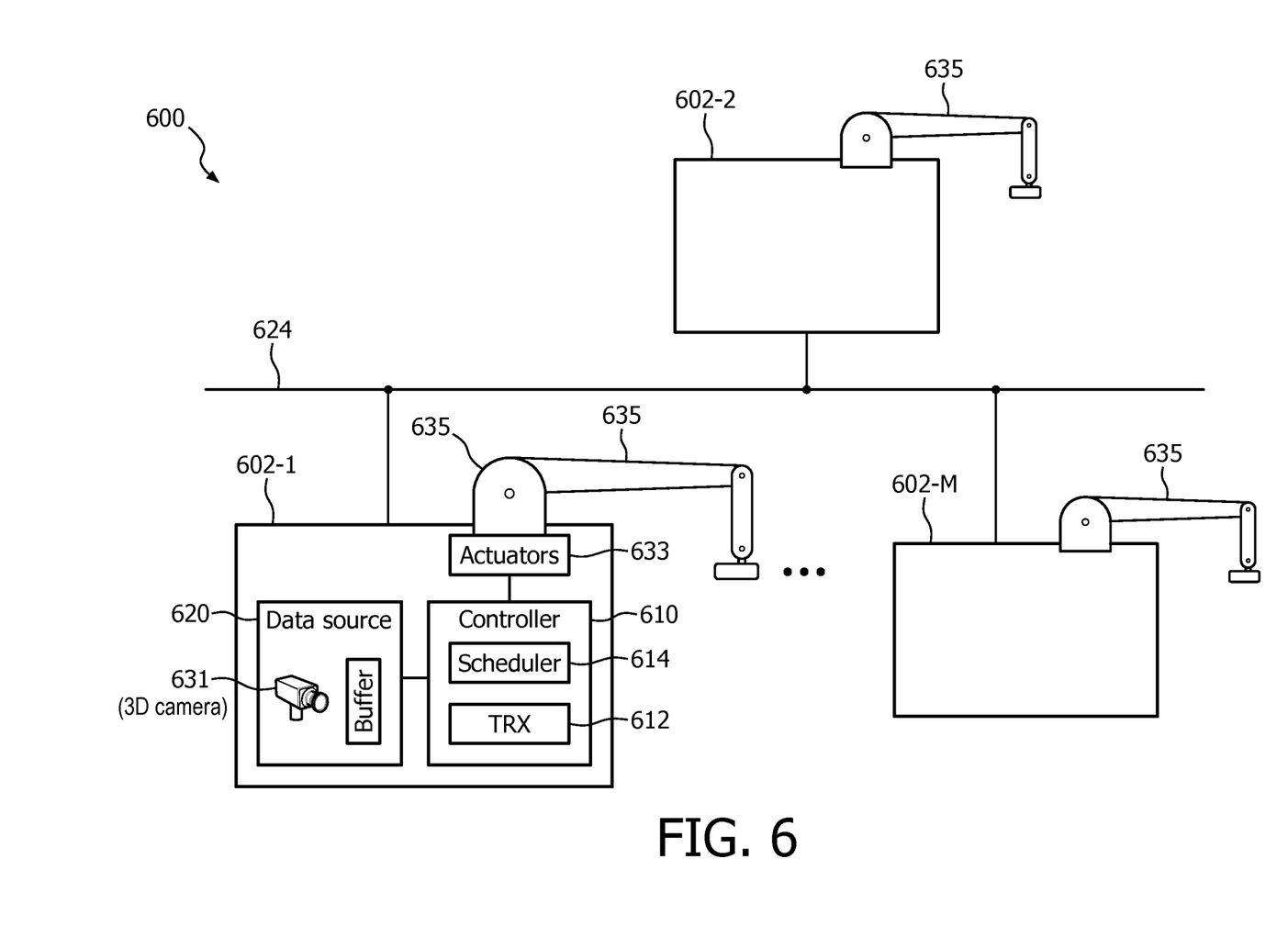
FIG. 6 shows a schematic of a portion of a robotic communication system operating in accordance with embodiments of the present system.

FIG. 6 shows a schematic diagram 600 of a portion of a robotic communication system operating in accordance with embodiments of the present system. The system 600 may be similar to the system 100 and may include a plurality of modules 602-1 through 602-M (generally **602-*x*) that may be similar to the modules 102-1 through 102-M, respectively, that may communicate with each other via HDR-WCL 624 that may be similar to the HDR-WCL 124. In accordance with embodiments of the present system, a data source 620 of the modules 602-*x* may include a camera 631 to capture image information (e.g., 2- or 3-dimensional image information). This image information may then be provided to the controller 610 for further processing and transmission to another of the modules 602-*x* via the HDR-WCL. The controller 610 may include a scheduler 614 and a TRX 612 that may be similar to the scheduler 114 and the TRX 112, respectively, of FIG. 1. Accordingly, the scheduler 614 may sequence RTOS information for transmission via the HDR-WCL 624 using any suitable communication method such as wireless transmission protocol standard, method, etc., which may be modified to form packets that may satisfy both RTOS and HDR transmission methods in accordance with embodiments of the present system. The RTOS information may be used to control actuators 633 that may control a multi-axis robot manipulator 635 of one or more selected modules 602-*x***.

Figure 7:
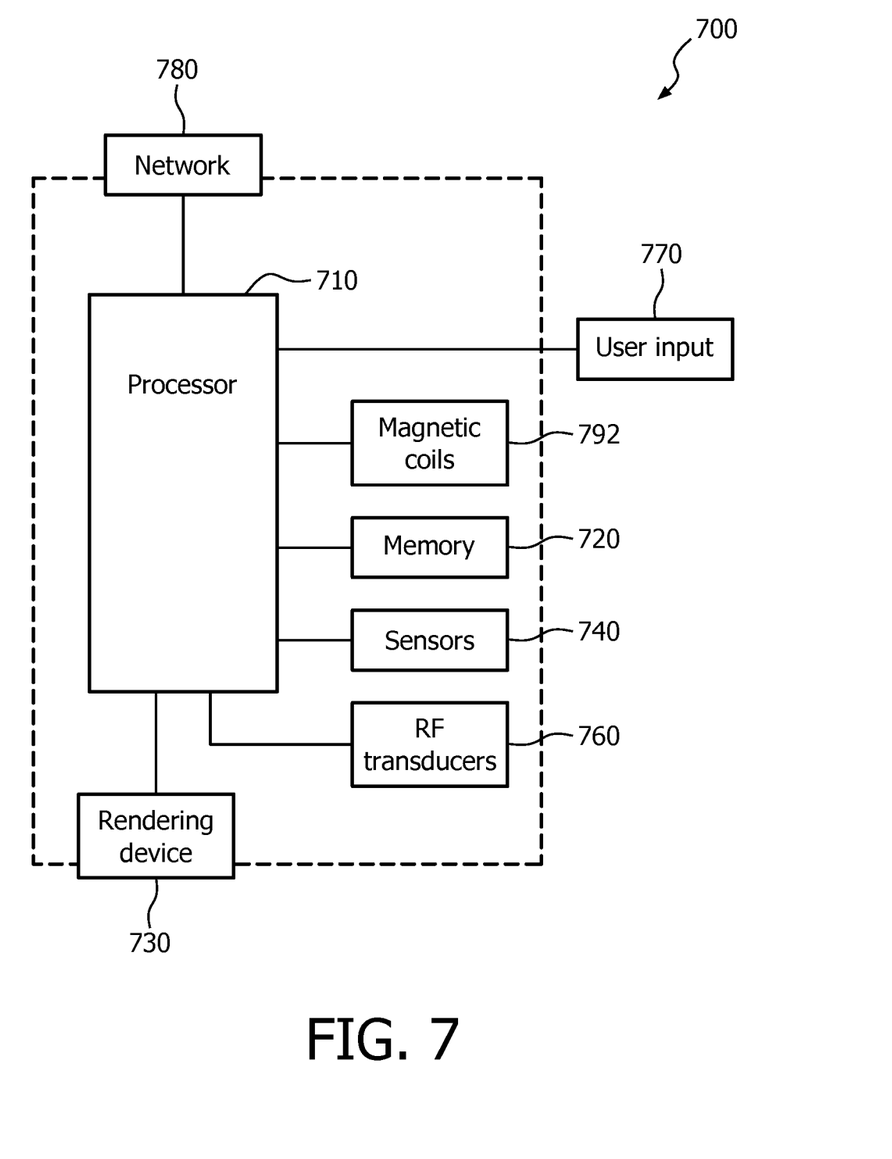
FIG. 7 shows a portion of a system in accordance with embodiments of the present system.

FIG. 7 shows a portion of a system 700 in accordance with embodiments of the present system. For example, a portion of the present system may include a processor 710 (e.g., a controller) operationally coupled to a memory 720, a rendering device such as a display 730, sensors 740, RF portion 760, magnetic coils 792, and a user input device 770. The memory 720 may be any type of device for storing application data as well as other data related to the described operation. The application data and other data are received by the processor 710 for configuring (e.g., programming) the processor 710 to perform operation acts in accordance with the present system. The processor 710 so configured becomes a special purpose machine particularly suited for performing in accordance with embodiments of the present system.

In accordance with embodiments of the present system, the operation acts may include one or more of those shown for example in FIG. 2 (e.g., scheduler, etc.) as well as others such as configuring an MRI system by, for example, controlling optional support actuators, the magnetic coils 792, and/or the RF portion 760. The support actuators may control a physical location (e.g., in x, y, and z axes) of a patient, as desired. The RF portion 760 may be controlled by the processor 710 to control RF transducers such as RF transmission coils and RF reception coils, and RF states (modes) such as tune/detune and synchronization states. The magnetic coils 792 may include main magnetic coils, gradient coils (e.g., x-, y-, and z-gradient coils), optional shimming coils, and may be controlled for example by the processor 710 to emit a main magnetic field and/or gradient fields in a desired direction and/or strength. The processor 710 may control one or more power supplies to provide power to the magnetic coils 792 so that a desired magnetic field is emitted at a desired time. The RF portion 760 may be controlled for example by the processor 710 to transmit RF pulses at the patient during a detune state and/or to receive echo information therefrom during a tune state.

A processor configured (e.g., programmed) as a reconstructor may process received signals such as the (MR) echo information and transform them (e.g., using one or more reconstruction techniques of embodiments of the present system) into content which may include image information (e.g., still or video images (e.g., video information)), data, and/or graphs that can be rendered on, for example, a user interface (UI) of the present system such as on the display 730, a speaker, etc. Further, the content may be stored in a memory of the system such as the memory 720 for later use as desired. Thus, operation acts may include requesting, providing, and/or rendering of content such as, for example, reconstructed image information obtained from the echo information. The processor 710 may render the content such as video information on a UI of the system such as a display of the system. The processor 710 may be configured to include a synchronization portion that may synchronize for example a clock of the RF portion 760 with a system clock. For example, the synchronization portion may synchronize the clock of the RF portion 760 utilizing the clock synchronization information from a received packet (e.g., see, FIG. 4).

The user input 770 may include a keyboard, a mouse, a trackball, or other device, such as a touch-sensitive display, which may be stand alone or be a part of a system, such as part of a personal computer, a personal digital assistant (PDA), a mobile phone (e.g., a smart phone), a monitor, a smart- or dumb-terminal or other device for communicating with the processor 710 via any operable link. The user input device 770 may be operable for interacting with the processor 710 including enabling interaction within a UI as described herein. Clearly the processor 710, the memory 720, display 730, and/or user input device 770 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 720 or other memory coupled to the processor 710. The program and/or program portions contained in the memory 720 may configure the processor 710 to implement the methods, operational acts, and functions disclosed herein. The memories may be distributed, for example between the clients and/or servers, or local, and the processor 710, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 710. With this definition, information accessible through a network is still within the memory, for instance, because the processor 710 may retrieve the information from the network for operation in accordance with the present system.

The processor 710 is operable for providing control signals and/or performing operations in response to input signals from the user input device 770 as well as in response to other devices of a network and executing instructions stored in the memory 720. The processor 710 may include one or more of a microprocessor, an application-specific or general-use integrated circuit(s), a logic device, etc. Further, the processor 710 may be a dedicated processor for performing in accordance with the present system or may be a general-purpose processor wherein only one of many functions operates for performing in accordance with the present system. The processor 710 may operate utilizing a program portion, multiple program segments, or may be a hardware device utilizing a dedicated or multi-purpose integrated circuit.

Accordingly, embodiments of the present system may provide a high-data-rate wireless-link with throughput in excess of 1 GBPS and which may use a packet size which may be determined to support RTOS deterministic timing requirements. Accordingly, embodiments of the present system may simultaneously provide for these requirements using a wireless link that may eliminate one or more cables (e.g., optical, RF) used by conventional MRI systems for communication between an MRI system controllers and RF coils.

Embodiments of the present system may be realized using a high-data-rate (HDR) communication protocol operating in accordance with embodiments of the present system. For example, embodiments of the present system may be operative to reduce a minimum packet size (defined by the HDR communication protocol) so that the modified high-data-rate communication method operating in accordance with embodiments of the present system may simultaneously support RTOS deterministic timing requirements & data rates sufficient for MRI medical imaging. For example, a reduction in minimum packet size (e.g., change) may be made in the MAC sublayer of the HDR communication protocol. In accordance with embodiments of the present system, this change (e.g., reduction) is not limited to a particular communications protocol. With an appropriate MAC layer modification, this change may be made in other protocols including, but not limited to, for example, the WiFi™ (e.g., 802.11) communication protocol. In accordance with embodiments of the present system, other layers may also be modified. For example, for time-division duplexing (TDD) systems, changes in the physical layer may be made to reduce switching time from TX to RX to support an RTOS application.

Embodiments of the present system may be applied to an MRI coil such as TX and/or RX coils of an MRI system such a TRX RF coil. For example, an MRI RX coil may perform three main functions: coil element de-tuning during TX excitation; coil element tuning to receive signal; and data transmission of received signal to the system. In accordance with embodiments of the present system, high-data-rate transmission of received MR signals to the system may be provided as well as real-time operating system (RTOS) control of a tune/detune feature of RF coil elements tuned to receive induced MR signals. A scheduler may be provided to sequence commands to be performed to generate an RF sequence suitable for inducing MR signals from an object-of-interest (OOI) such as a patient. These commands may be transmitted as RTOS information over a wireless coupling of the system (e.g., formed by a HDR-WCL, etc.) and may be implemented for example in less than 1 millisecond. The wireless coupling may further provide for transmission of HDR data such as MR image data. The scheduler may operate in intervals (e.g., a scheduler interval) having predetermined duration such as 0.5 millisecond. The commands for a given interval f(n), may be transmitted during a previous interval f(n−1).

In accordance with embodiments of the present system, the scheduler interval may also impact the data packet architecture. For example, since control signals need to be sent and implemented during the shortest scheduler interval, these messages must be short in duration. The received data information such as HDR data (e.g., acquired digitized MR data) may be sent as packets as soon as sufficient data to fill a message has been acquired. For example, to maximize the efficiency of a data link (e.g., the HDR-WCL), these packets may be larger than control messages. Further, the size of a data packet may be determined for example by data link throughput and/or data link availability.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention. Further variations of the present system would readily occur to a person of ordinary skill in the art and are encompassed by the following claims.

Finally, the above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. In addition, the section headings included herein are intended to facilitate a review but are not intended to limit the scope of the present system. Accordingly, the specification and drawings are to be regarded in an illustrative manner and are not intended to limit the scope of the appended claims.

Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) no specific sequence of acts or steps is intended to be required unless specifically indicated;

i) the term "plurality of" an element includes two or more of the claimed element, and does not imply any particular range of number of elements; that is, a plurality of elements may be as few as two elements, and may include an immeasurable number of elements; and j) the term and/or and formatives thereof should be understood to mean that only one or more of the listed elements may need to be suitably present in the system in accordance with the claims recitation and in accordance with one or more embodiments of the present system.

The invention claimed is:

1. An image acquisition system, comprising:
   at least one processor configured to control:
      a transmitter to form packets for transmission over a high-data-rate (HDR) wireless communication link (HDR-WCL,
      an image acquisition device to acquire image data and form HDR data, and
      a scheduler to acquire control information for controlling at least one function of the image acquisition system during the image acquisition, determine a restricted packet size for the packets of the HDR-WCL in accordance with at least deterministic timing requirements of the system, and determine a schedule for transmitting both the control information and the image data in a single wireless data stream with the control information in a corresponding packet of the packets in accordance with the deterministic timing requirements of the image acquisition system and the restricted packet size,
      wherein the at least one processor places the control information in selected packets for transmission according to the schedule and places the image data in at least one other packet.

2. The image acquisition system of claim 1, wherein the transmitter is further configured to restrict the packet size of the packets for transmission based upon the restricted packet size determined by the scheduler.

3. The image acquisition system of claim 1, wherein the restricted packet size is determined by the scheduler to be a packet size which provides for real-time-operating-system (RTOS) control and high-data-rate information transfer of the HDR data using the same HDR-WCL.

4. The image acquisition system of claim 1, wherein the at least one processor controls the transmitter to establish the HDR-WCL in accordance with a wireless communication protocol standard with a changed packet size determined by the restricted packet size.

5. The image acquisition system of claim 4, wherein the packet size of the restricted packets are reduced from a minimum packet size determined in accordance with the wireless communication protocol standard to provide real-time-operating-system (RTOS) control.

6. The image acquisition system of claim 1, wherein the at least one processor:
   determines whether a real-time-operating-system (RTOS) control word is scheduled for transmission,
   places the control word in a current packet for transmission when it is determined that the RTOS control word is currently scheduled for transmission, and
   places the image data in packets when it is determined that the RTOS control word is not currently scheduled for transmission.

7. The image acquisition system of claim 1, wherein the at least one processor, at a medium access control (MAC) sublayer of an open systems interconnection (OSI) model protocol stack, changes a packet size by reducing the packet size to the determined restricted packet size.

8. The image acquisition system of claim 1, wherein the control information comprises at least magnetic resonance (MR) sequence information for controlling at least one of gradient and radio-frequency (RF) coils.

9. The image acquisition system of claim 1, wherein the image information is acquired using an optical or magnetic resonance (MR) methods.

10. The image acquisition system of claim 1, further comprising a robotic manipulator which is controlled by the at least one processor in accordance with the control information.

11. A data transmission method performed by an image acquisition system having at least one processor, the data transmission method controlled by the at least one processor and comprising acts of:
    controlling a transmitter to form packets for transmission over a high-data-rate (HDR) wireless communication link (HDR-WCL);
    controlling an image acquisition device to acquire image data and form corresponding HDR data; and
    controlling a scheduler to: acquire control information for controlling at least one function of the image acquisition system during the image acquisition, determine a restricted packet size for the packets of the HDR-WCL in accordance with at least deterministic timing requirements of the system, and determine a schedule for transmitting both the control information and the image data in a single wireless data stream with the control information in a corresponding packet of the packets in accordance with the deterministic timing requirements of the image acquisition system and the restricted packet size,
    wherein the at least one processor is operative to place the control information in selected packets for transmission according to the schedule and place the image data in at least one other packet.

12. The data transmission method of claim 11, further comprising an act of restricting the packet size of the packets for transmission based upon the restricted packet size determined by the scheduler.

13. The data transmission method of claim 11, wherein the restricted packet size is determined by the scheduler to be a packet size which provides for real-time-operating-system (RTOS) control and high-data-rate information transfer of the HDR data using the same HDR-WCL.

14. The data transmission method of claim 11, further comprising an act of controlling the transmitter to establish the HDR-WCL in accordance with a wireless communication protocol standard with a changed packet size determined by the restricted packet size.

15. The data transmission method of claim 14, wherein the packet size of the restricted packets are reduced from a minimum packet size determined in accordance with the wireless communication protocol standard to provide real-time-operating-system (RTOS) control.

16. A computer program stored on a computer readable memory medium the computer program configured to perform packet communication, the computer program comprising:
    a program portion configured to:
       control a transmitter to form the packets for transmission over a high-data-rate (HDR) wireless communication link (HDR-WCL);
       control an image acquisition device to acquire image data and form corresponding HDR data; and
       control a scheduler to: acquire control information for controlling at least one function of the image acquisition system during the image acquisition, determine a restricted packet size for the packets of the HDR-WCL in accordance with at least deterministic timing requirements of the system, and determine a schedule for transmitting the control information in a corresponding packet of the packets in accordance with the deterministic timing requirements of the image acquisition system and the restricted packet size, wherein the at least one processor is operative to place the control information in selected packets for transmission according to the schedule and place the image data in at least one other packet.

17. The computer program of claim 16, wherein the program portion is further configured to restrict the packet size of the packets for transmission based upon the restricted packet size determined by the scheduler.

18. The computer program of claim 16, wherein the program portion is further configured to form the restricted packet size to be a packet size which provides for real-time-operating-system (RTOS) control and high-data-rate information transfer of the HDR data using the same HDR-WCL.

19. The computer program of claim 16, wherein the program portion is further configured to control the transmitter to establish the HDR-WCL in accordance with a wireless communication protocol standard with a changed packet size determined by the restricted packet size.

20. The computer program of claim 19, wherein the program portion is further configured to reduce the packet size of the restricted packets from a minimum packet size determined in accordance with the wireless communication protocol standard to provide real-time-operating-system (RTOS) control.

* * * * *